(12) United States Patent
Trefonas, III

(10) Patent No.: US 6,280,911 B1
(45) Date of Patent: Aug. 28, 2001

(54) PHOTORESIST COMPOSITIONS COMPRISING BLENDS OF IONIC AND NON-IONIC PHOTOACID GENERATORS

(75) Inventor: Peter Trefonas, III, Medway, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/150,965

(22) Filed: Sep. 10, 1998

(51) Int. Cl.$^7$ ........................................................ G03F 7/26
(52) U.S. Cl. .......................... 430/326; 430/914; 430/921; 430/270.1
(58) Field of Search ................. 430/270.1, 326, 430/914, 921

(56) References Cited

U.S. PATENT DOCUMENTS

| | | | |
|---|---|---|---|
| 5,322,765 | * | 6/1994 | Clecak et al. .................... 430/326 |
| 5,498,765 | * | 3/1996 | Carpenter, Jr. et al. ............ 430/323 |
| 5,532,106 | * | 7/1996 | Frechet et al. .................... 430/191 |
| 5,558,971 | * | 9/1996 | Urano et al. ...................... 430/170 |
| 5,595,855 | * | 1/1997 | Padmanaban et al. ............ 430/270.1 |
| 5,731,364 | | 3/1998 | Sinta et al. ........................ 522/31 |
| 5,800,963 | * | 9/1998 | Knors et al. ...................... 430/271.1 |
| 5,981,140 | * | 11/1999 | Sato et al. ........................ 430/270.1 |

FOREIGN PATENT DOCUMENTS

| | | |
|---|---|---|
| 0 831 369 A2 | 3/1998 | (EP) . |
| 0 898 201 A1 | 2/1999 | (EP) . |
| 09124533 * | 5/1997 | (JP) . |

OTHER PUBLICATIONS

Allen, R.D., et al. "193 nm Single Layer Positive Resists", SPIE, vol. 2438, 1995, pp. 474–485.*
English translation of JP 7–219216, Seiki et al., Aug. 1995.*
Abstract—Database WPI, Section Ch, Week 199542, Derwent Publications Ltd., London, GB; Class A21, AN 1995–323797, XP002127118 & JP 07 219216 A (Nippon Kayaku KK), Aug. 18, 1995.

* cited by examiner

Primary Examiner—Rosemary E. Ashton
(74) Attorney, Agent, or Firm—Peter F. Corless; Darryl P. Frickey; Edwards & Angell, LLP

(57) ABSTRACT

The invention provides new photoresist compositions that contain a resin binder and a blend of non-ionic and ionic PAGS. Preferred resists of the invention preferably are imaged with 248 nm and/or 193 nm exposure wavelengths to provide highly resolved small dimension features.

10 Claims, No Drawings

PHOTORESIST COMPOSITIONS COMPRISING BLENDS OF IONIC AND NON-IONIC PHOTOACID GENERATORS

BACKGROUND OF THE INVENTION

1. Field of the Invention

This invention relates to new photoresist compositions that contain a blend of ionic and nonionic photoacid generator compounds. Compositions of the invention are highly useful as deep U.V. photoresists (including imaging at 193 nm and 248 nm) with the capability of forming highly resolved features of submicron dimensions.

2. Background

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define an image desired to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

Known photoresists can provide features having resolution and size sufficient for many existing commercial applications. However for many other applications, the need exists for new photoresists that can provide highly resolved images of submicron dimension.

Various attempts have been made to alter the make-up of photoresist compositions to improve performance of functional properties. Among other things, a variety of photoactive compounds have been reported for use in photoresist compositions. See, e.g., U.S. Pat. No. 4,450,360 and European Application 615163.

Relatively recently interest has increased in photoresists that can be photoimaged with deep U.V. radiation. Such photoresists offer the potential of forming images of smaller features than may be possible at longer wavelength exposure. As is recognized by those in the art, "deep U.V. radiation" refers to exposure radiation having a wavelength in the range of about 350 nm or less, more typically in the range of about 300 nm or less. While a number of deep U.V. resists have been reported, the need clearly exists for new deep U.V. resists that can provide highly resolved fine line images as well as acceptable photospeed and other lithographic properties. Particular interest exists in resists that can be imaged with sub-250 nm wavelengths such as KrF radiation (ca. 248 nm) or sub-200 nm wavelengths such as ArF radiation (193 nm).

SUMMARY OF THE INVENTION

We have now discovered novel blends of photoacid generators compounds ("PAGs") that can formulated in photoresist compositions to provide excellent lithographic properties, particularly chemically-amplified positive-acting resists. Preferred PAG blends can be photoactivated upon exposure to deep U.V. radiation, particularly 248 nm and/or 193 nm exposure wavelengths.

PAG blends of the invention comprise at least one ionic PAG and at least one non-ionic PAG. For example, typical ionic PAGs include onium salts such as iodonium salts, sulfonium salts and the like. Suitable non-ionic PAGs include e.g. imidosulfonates, sulfonate esters, halogenated compounds that generate a halo-acid (e.g. HBr) upon photoactivation, and the like.

As referred to herein, the terms ionic and non-ionic with respect to PAGS are used in accordance with their-art recognized meaning, i.e. an ionic PAG includes in the PAG molecule an ionic bond that involves an electrostatic attraction between oppositely charged ions, whereas a non-ionic PAG does not have any such ionic bonds, but rather typically has all covalent-type bonds. See, for example, Morrison and Boyd, Organic Chemistry, pages 3–5 (3$^{rd}$ ed., 1981).

The invention also provides photoresist compositions that comprise a blend of an ionic PAG and a non-ionic PAG. The PAG blend can be used in a variety of resist systems, and preferably a PAG blend is employed in a resist composition that comprises an acrylate-containing polymer as a resin binder component. In particular, the PAG blend is preferably formulated in a chemically-amplified positive-acting resist, where the resist contains a polymer with photoacid-labile groups, particularly pendant acid-labile groups such as can be provided by condensation of alkyl acrylate monomers, e.g. an alkyl acrylate-phenol copolymer, or a polymer that contains alkyl acrylate repeat units and that is essentially or completely free of phenyl or other aromatic units. Unless otherwise indicated, the term acrylate as used herein refers to vinyl esters in general, including substituted compounds such as methacrylate and the like.

The invention also provide methods for forming relief images of the photoresists of the invention, including methods for forming highly resolved patterned photoresist images (e.g. a patterned line having essentially vertical sidewalls) of sub-micron and even sub-half micron dimensions.

The present invention further provides articles of manufacture comprising substrates such as a microelectronic wafer or a flat panel display substrate having coated thereon the photoresists and relief images of the invention. Other aspects of the invention are disclosed infra.

DETAILED DESCRIPTION OF THE INVENTION

As discussed above, PAG blends of the invention comprise at least one ionic PAG and at least one non-ionic PAG.

A variety of ionic PAGs can be employed in the PAG blends and photoresist compositions of the invention.

Onium salts are generally preferred ionic PAGs for use in accordance with the invention. Examples of suitable onium salts include those that contain halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryl-diazonium salts and onium salts of group Va and B, Ia and B and I of the Periodic Table, for example, halonium salts, quaternary ammonium, phosphonium and arsonium salts, aromatic sulfonium salts and sulfoxonium salts or selenium salts. Onium salts have been described in the literature such as in U.S. Pat. Nos. 4,442,197; 4,603,101; and 4,624,912.

Generally preferred onium salts are iodonium salt photoacid generators, such as those compounds disclosed in published European application 0 708 368 A1. Such salts include those represented by the following formula:

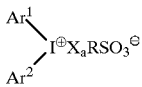

where $Ar^1$ and $Ar^2$ each independently represents a substituted or unsubstituted aryl group. A preferred example of the aryl group includes a $C_{6-14}$ monocyclic or a condensed ring aryl group. Preferred examples of the substituent on the aryl group include an alkyl group, a haloalkyl group, a cycloalkyl group, an aryl group, an alkoxy group, a nitro group, a carboxyl group, an alkoxycarbonyl group, a hydroxyl group, mercapto group, and a halogen atom.

Two particularly suitable iodonium PAGs are the following PAGS 1 and 2:

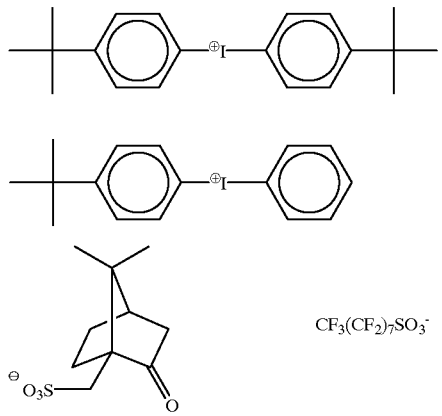

Such compounds can be prepared as disclosed in European Patent Application 96118111.2 (publication number 0783136), which details the synthesis of above PAG 1. Briefly, PAG 1 can be prepared by reaction of a mixture of potassium iodate, t-butylbenzene and acetic anhydride with sulfuric acid added dropwise to the mixture with ice-bath cooling. The reaction mixture is then stirred at room temperature for approximately 22 hours, water added with cooling to about 5–10° C. and then washing with hexane. The aqueous solution of diaryliodium hydrogensulfate is then cooled to about 5–10° C. and then (+/−)-10-camphorsulfonic acid added followed by neutralization with ammonium hydroxide.

Also suitable are the above two iodonium compounds complexed with anions other than the above-depicted camphorsulfonate groups. In particular, preferred anions include those of the formula $RSO_3$ where R is adamantane, alkyl (e.g. $C_{1-12}$ alkyl) and perfluoroalkyl such as perfluoro ($C_{1-12}$ alkyl), particularly perfluoro counter anions of perfluorooctanesulfonate, perfluorononanesulfonate and the like.

Sulfonium salts are particularly suitable ionic photoacid generators for PAG blends and resists of the invention, such as compounds of the following formula:

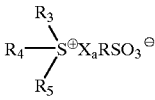

wherein $R^3$, $R^4$ and $R^5$ each independently represents a substituted or unsubstituted alkyl group or aryl group. With regard to each of the above formulae, preferred examples of the substituted or unsubstituted alkyl group and aryl group include a $C_{6-14}$ aryl group, a $C_{1-5}$ alkyl group, and substituted derivatives thereof. Preferred examples of the substituent on the alkyl group include a $C_{1-8}$ alkoxy group, a $C_{1-8}$ alkyl group, nitro group, carboxyl group, hydroxyl group, and a halogen atom. Preferred examples of the substituent on the aryl group include a $C_{1-8}$ alkoxy group, carboxyl group, an alkoxycarbonyl group, a $C_{1-8}$ haloalkyl group, a $C_{5-8}$ cycloalkyl group and a $C_{1-8}$ alkylthio group. Two of $R^3$, $R^4$ and $R^5$ and $Ar^1$ and $Ar^2$ may be connected to each other via its single bond or a substituent.

A variety of non-ionic PAGs can be employed in the PAG blends and photoresist compositions of the invention.

Preferred non-ionic photoacid generators include imidosulfonates such as compounds of the following formula:

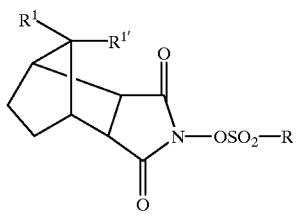

wherein each $R^1$ and $R^{1'}$ are each independently hydrogen or $C_{1-12}$ alkyl, more preferably hydrogen or methyl; and R is as defined above, i.e. alkyl (e.g. $C_{1-12}$ alkyl), camphor, adamantane and other cycloalkyl typically having from 5 to about 12 ring members, and perfluoroalkyl such as perfluoro ($C_{1-12}$alkyl), particularly perfluorinated groups such as perfluorooctanesulfonate, perfluorobutanesulfonate and the like. A specifically preferred photoacid generator of this class is N-[(perfluorooctane sulfonyl)oxy]-5-norbornene-2,3-dicarboximide.

N-sulfonyloxyimide photoacid generators also are suitable for use as a non-ionic PAG in PAG blends and compositions of the invention, including those N-sulfonyloxyimides disclosed in International application WO94/10608, such as compounds of the following formula:

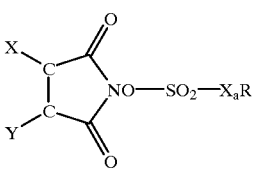

where the carbon atoms form a two carbon structure having a single, double or aromatic bond, or, alternatively, wherein they form a three carbon structure, that is, where the ring is instead a five member or six member ring; $X_aR$ is —$C_nH_{2n+1}$ where n=1 to 8, —$C_nF_{2n+1}$ where n=1 to 8, a camphor substituent, -2(9,10-diethoxyanthracene), —$(CH_2)_n$—Z or —$(CF_2)_n$—Z where n=1 to 4 and where Z is H, $C_{1-6}$ alkyl, a camphor substituent, -2-(9,10-diethoxyanthracene), or aryl such as phenyl; X and Y (1) form a cyclic or polycyclic ring which may contain one or more hetero atoms, or (2) form a fused aromatic ring, or (3) may be independently hydrogen, alkyl or aryl, or (4) may be attached to another sulfonyloxyimide containing residue, or (5) may be attached to a polymer chain or backbone, or alternatively, form

where $R_1$ is selected from the group consisting of H, acetyl, acetamido, alkyl having 1 to 4 carbons where m=1 to 3, $NO_2$ where m=1 to 2, F where m=1 to 5, Cl where m=1 to 2, $CF_3$ where m=1 to 2, and $OCH_3$ where m=1 to 2, and where m may otherwise be from 1 to 5, and combinations thereof, and where X and Y (1) form a cyclic or polycyclic ring which may contain one or more hetero atoms, (2) form a fused aromatic ring, (3) may be independently H, alkyl or aryl, (4) may be attached to another sulfonyloxyimide containing residue, or (5) may be attached to a polymeric chain or backbone.

Another class of photoacid generators suitable for use as a non-ionic compound in the blends and resists of the invention include those disclosed in U.S. Pat. No. 5,558,976. Representative examples of these photoacid generators include:

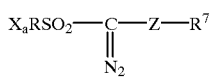

where XaR suitably is phenyl optionally substituted by halogen, $C_{1-6}$ alkyl, $C_{1-6}$ alkoxy, or $C_{1-6}$ haloalkyl, $R^7$ is a straight-chain, branched or cyclic alkyl group having from 1 to 10 carbon atoms and Z is a sulfonyl group or a carbonyl group:

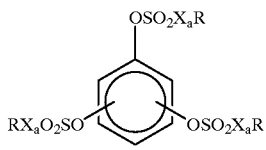

where R is as defined above; and

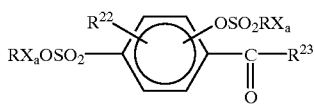

where $R^{22}$ is hydrogen, hydroxyl or a group represented by the formula $X_aRSO_2O$—where $X_aR$ is as defined above, and $R^{23}$ is a straight or branched alkyl group having from 1 to 5 carbon atoms or a group represented by the formula:

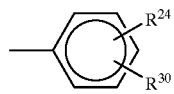

where $R^{24}$ and $R^{30}$ are independently a hydrogen atom, a halogen atom, a straight chain or branched alkyl group having 1–5 carbon atoms, a straight chain or branched alkoxy group having 1–5 carbon atoms, or a group of the formula:

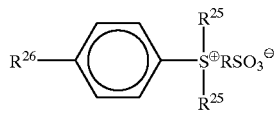

where $R^{25}$ is a straight chain or branched alkyl group having 1–4 carbon atoms, a phenyl group, a substituted phenyl group or an aralkyl group; $R^{26}$ is a hydrogen atom, a halogen atom or a straight-chain, branched or cyclic alkyl group having 1–6 carbon atoms; $R^{27}$ is a straight chain or branched perfluoroalkyl group having 1–8 carbon atoms, a straight chain, branched or cyclic alkyl group having 1–8 carbon atoms, a 1-naphthyl group, a 2-naphthyl group, a 10-camphor group, a phenyl group, a tolyl group, a 2,5-dichlorophenyl group, a 1,3,4-trichlorophenyl group or a trifluoromethylphenyl group.

Nitrobenzyl-based photoacid generators also may be employed as a non-ion PAG components of the blends and resists of the invention, including those disclosed in EPO published application No. EP 0 717 319 A1. Suitable nitrobenzyl-based compounds include those of the following formula:

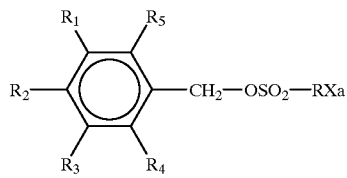

where each $R_1$, $R_2$ and $R_3$ are individually selected from the group consisting of hydrogen and lower alkyl group having from 1–4 carbon atoms; and $R_4$ and $R_5$ are individually selected from the group consisting of $CF_3$ and $NO_2$ and $RX_a$ is optionally substituted carbocyclic aryl, particularly optionally substituted phenyl such as phenyl where the 2, 3, and 4 position substituents are selected from hydrogen and $C_{1-4}$ alkyl and where the 5 and 6 ring positions are selected from $CF_3$, $NO_2$ and $SO3R'$ where R' of optionally substituted $C_{1-12}$ alkyl or aryl such as phenyl where such optional substituents may be $C_{1-4}$ alkyl, $C_{1-4}$ alkoxy, $NO_2$ or $CF_3$.

Disulfone derivatives are also suitable non-ionic photoacid generators for use in accordance with the invention. Suitable compounds are disclosed e.g. in published European application 0 708 368 A1. Such materials may be represented by the following formula:

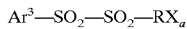

wherein $RX_a$ is preferably as defined immediately above and $Ar^3$ represents a substituted or unsubstituted aryl group. A preferred example of the aryl group includes a $C_{6-14}$ monocyclic or condensed-ring aryl group. Preferred examples of the substituent on the aryl group include an alkyl group, a haloalkyl group, a cycloalkyl group, an aryl group, an alkoxy group, nitro group, carboxyl group, an alkoxycarbonyl group, hydroxyl group, mercapto group, and halogen.

Halogenated non-ionic, photoacid generating compounds are also suitable for use in blends and resists of the invention and include, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclodecane; 1,10- dibromodecane; 1,1-bis[p-chlorophenyl]-2,2-dichloroethane; 4,4-dichloro-2-(trichloromethyl) benzhydrol (Kelthane); hexachlorodimethyl sulfone; 2-chloro-6-(trichloromethyl) pyridine; o,o-diethyl-o-(3,5,6-trichloro-2-pyridyl)phosphorothionate; 1,2,3,4,5,6-hexachlorocyclohexane; N(1,1-bis[p-chlorophenyl]-2,2,2-trichloroethyl)acetamide; tris[2,3-dibromopropyl] isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972. Acid generators that are particularly preferred for deep U.V. exposure include 1,1-bis (p-chlorophenyl)-2,2,2-trichloroethane (DDT); 1,1-bis(p-methoxyphenol)-2,2,2-trichloroethane; 1,1-bis (chlorophenyl)-2,2,2trichloroethanol; tris(1,2,3-methanesulfonyl)benzene; and tris(trichloromethyl)triazine.

In many instances, it will be preferred where the ionic and non-ionic PAGs generate the same or same class of acid compound (photoproduct) upon exposure to activating radiation during irradiation of the photoresist layer, e.g. photoproducts that preferably have similar diffusion characteristics and similar acid strengths. For photoproducts that both are of the same class, e.g. the photoproducts of the ionic and non-ionic PAGs both be halo-acids such as HBr, or more preferably sulfonate acids such where both the non-ionic and ionic PAG photoproducts are camphor sulfonic acids or perfluoro($C_{1-16}$)alkyl sulfonic acids such as perfluorooctane sulfonic acid or perfluorobutane sulfonic acid.

As discussed above, a PAG blend of the invention is preferably used in positive-acting chemically amplified resist compositions. Such compositions comprise a dissolution inhibitor component, e.g. a resin with photoacid labile moieties. Preferred deblocking components are resins that have acrylate repeat units that provide pendant ester groups which groups can undergo cleavage to provide polar acid groups in the presence of photogenerated acid.

More particularly, suitable deblocking pendant ester groups include those of the Formula —WC(=O)O$R^5$, wherein W is a linker such as a chemical bond, an alkylene particularly $C_{1-3}$ alkylene, or carbocyclic aryl such as phenyl, or aryloxy such as phenoxy, and $R^5$ is a suitable ester moiety such as an optionally substituted alkyl (including cycloalkyl) suitably having from 1 to about 20 carbons, more preferably about 4 to about 12 carbons; optionally substituted alkenyl (including cycloalkenyl) group suitably having from 2 to about 20 carbons, more preferably about 4 to about 12 carbons; optionally substituted alkynyl group suitably having from 2 to about 20 carbons, more preferably about 4 to about 12 carbons; optionally substituted alkoxy group suitably having from 1 to about 20 carbons, more preferably 2 to about 12 carbons; or a heteroalicyclic group that contains one or more N, O or S atoms and one or more rings having from 4 to about 8 ring members such as tetrahydrofuranyl, thienyl, tetrahydropyranyl, morpholino and the like. Specifically preferred $R^5$ groups include e.g. t-butyl, tetrahydropyran, ethoxyethyl, or an alicyclic group including bridged groups such as such as adamantyl including 2-methyl-2-adamantyl, norbornyl, isobornyl and the like. Also preferred are polymers having ester repeat units of the above Formula where $R^5$ is a noncyclic or single ring alkyl group having 5 or more carbons and two or more secondary or tertiary carbon radicals, such as pendant esters of the following structures 1 through 17 (such polymers are also disclosed in copending and commonly assigned application Ser. No. 09/143,462, filed on Aug. 28, 1998):

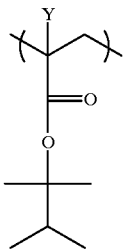

1

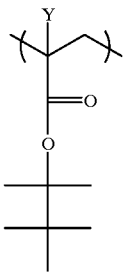

2

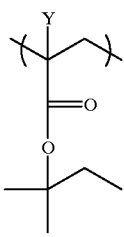

3

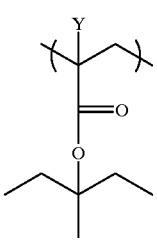

4

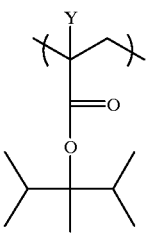

5

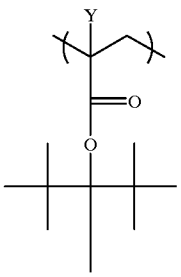

6

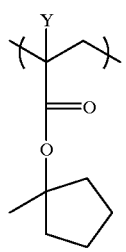
7
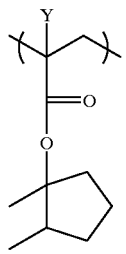
8
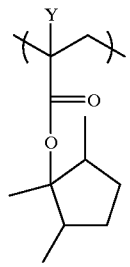
9
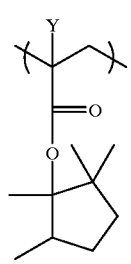
10
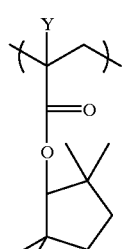
11
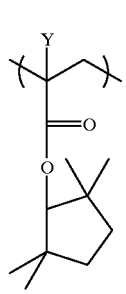
12
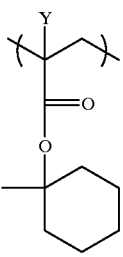
13
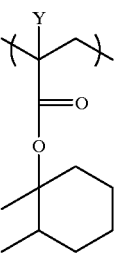
14
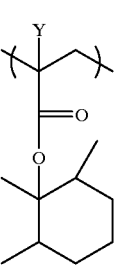
15
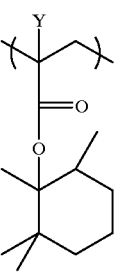
16
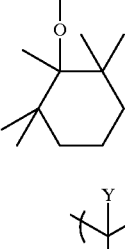
17
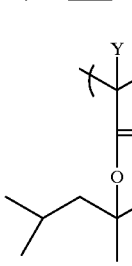

In each of the above structures 1 through 17, the substituent Y is preferably hydrogen or methyl, more preferably methyl.

Polymers for as a resin binder component also may have other units such as pendant cyano and itaconic anhydride groups. Preferably, the itaconic anhydride moiety will be directly pendant to the polymer backbone, i.e. the moiety is directly pendant to a polymer bridge group without any alkylene, aryl or other group interposed between the polymer bridge group and the itaconic anhydride group. While the cyano group is preferably directly pendant to the polymer backbone, a linker group also may be interposed between the cyano group and a polymer bridge group.

Polymers used as resin binders of resists of the invention optionally may contain still further units such as groups that contribute to aqueous developability of a photoresist. For example, preferred polymer groups that contribute to aqueous developability contain carboxy or hydroxy moieties such as may be provided by condensation of acrylic acid, methacrylic acid, 2-hydroxyethylmethacrylate, or other monomers. Other optional polymer units include those that may be provided by condensation of a vinyl alicyclic group, e.g. 2-adamantyl-2-methyl methacrylate, isobornyl methacrylate and the like, or a non-cyclic alkyl group such as t-butylmethacrylate and the like. Generally preferred acid labile polymers for use in chemically-amplified photoresists of the invention have one or more polymerized units of monomers of isobornyl methacrylate, methacrylonitrile, itaconic anhydride, methacrylic acid, tert-butyl methacrylate, 2-methyl-2adamntyl methacrylate or 2,3-dimethyl-2-butyl-methacrylate.

A preferred resin binder for use at 248 nm imaging is a copolymer containing both phenolic and non-phenolic units that preferably are acrylate units. One such copolymer binder that is especially preferred has repeating units x and y of the following formula:

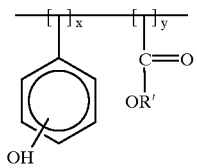

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a $M_w$ of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornyl or vinyl cyclohexanol compound, also may be used as a resin binder in compositions of the invention. Such copolymers suitably will have a $M_w$ of from about 8,000 to about 50,000, and a molecular weight distribution of about 3 or less. Such copolymers also are disclosed in U.S. Pat. No. 5,492,793 to Bretya et al.

Polymers of the invention can be prepared by a variety of methods. One suitable method is free radical polymerization, e.g., by reaction of selected monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. tetrahydrofuran, dimethylformamide and the like. Suitable reaction temperatures for any particular system can be readily determined empirically by those skilled in the art based on the present disclosure. Monomers that can be reacted to provide a polymer of the invention can be readily identified by those skilled in the art based on the present disclosure. For example, suitable monomers include e.g. acrylate, including methacrylate, t-butylacrylate, acrylonitrile, methacrylonitrile, itaconic anhydride and the like. A variety of free radical initiators may be employed to prepare the copolymers of the invention. For example, azo compounds may be employed such as azo-bis-2,4-dimethylpentanenitrile. Peroxides, peresters, peracids and persulfates also could be employed. See the examples which follow for synthesis and use of preferred resin binders.

Unless indicated otherwise above, a polymer used as a resin binder component of a resist of the invention typically will have a weight average molecular weight ($M_w$) of 1,000 to about 100,000, more preferably about 2,000 to about 30,000, still more preferably from about 2,000 to 15,000 or 20,000, with a molecular weight distribution ($M_w/M_n$) of about 3 or less, more preferably a molecular weight distribution of about 2 or less. Molecular weights (either $M_w$ or $M_n$) of the polymers of the invention are suitably determined by gel permeation chromatography.

Preferred polymers also will exhibit a sufficiently high $T_g$ to facilitate use of the polymer in a photoresist. Thus, preferably a polymer will have a $T_g$ greater than typical softbake (solvent removal) temperatures, e.g. a $T_g$ of greater than about 100° C., more preferably a $T_g$ of greater than about 110° C., still more preferably a $T_g$ of greater than about 120° C.

For 193 nm imaging applications, preferably a resist resin binder component will be substantially free of any phenyl or other aromatic groups. For example, preferred polymers for use in 193 imaging contain less than about 1 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged 193 nm.

Photoresists of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from 5 to 30 percent by weight of the total weight of a resist's dry components. A preferred additive is a basic compound, such as tetrabutylammonium hydroxide (TBAH), or tetrabutylammonium lactate, which can enhance resolution of a developed image. For resists imaged at 193 nm, a preferred added base is a hindered amine such as diazabicycloundecene, diazabicyclononene or di-terbutylethanolamine. Such an amine may be suitably present in amount of about 0.03 to 5 to 10 weight percent, based on total solids (all components except solvent) of a resist composition.

The PAG blend component should be present in a photoresist formulation in amount sufficient to enable generation of a latent image in a coating layer of the resist. More specifically, the PAG blend will suitably be present in an amount of from about 0.5 to 40 weight percent of total solids of a resist, more typically from about 0.5 to 10 weight percent of total solids of a resist composition. The ionic and non-ionic PAGS of the blend may be suitably present in about equivalent molar amounts in a resist composition, or each PAG may be present in differing molar amounts. It is typically preferred however that each of the ionic or non-ionic classes of PAG is present in an amount of at least about 20 to 25 mole percent of total PAG present in a resist formulation. In many instances, it will be preferred that a non-ionic PAG constitutes a majority by weight of the photoacid generator composition, i.e. where the non-ionic photoacid generator is present in a weight excess relative to the ionic photoacid generator in a photoresist composition.

Additionally, mutiple PAGs of a single class of ionic or non-ionic may be present in a resist formulation, i.e. two or more different ionic PAGs and/or two or more different non-ionic PAGs may be present in a resist formulation.

The resin binder component of resists of the invention are typically used in an amount sufficient to render an exposed coating layer of the resist developable such as with an aqueous alkaline solution. More particularly, a resin binder will suitably comprise 50 to about 90 weight percent of total solids of the resist.

The photoresists of the invention are generally prepared following known procedures with the exception that a photoactive component of the invention is substituted for prior photoactive compounds used in the formulation of such photoresists. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; lactates such as ethyl lactate or methyl lactate, with ethyl lactate being preferred; proponiates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone. Typically the solids content of the photoresist varies between 5 and 35 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation, optionally post-exposure baked to create or enhance solubility differences between exposed and nonexposed regions of the resist coating layer, and then developed preferably with an aqueous alkaline developer to form a relief image.

The substrate suitably can be any substrate used in processes involving photoresists such as a microelectronic wafer. For example, the substrate can be a silicon, silicon dioxide or aluminum-aluminum oxide microelectronic wafer. Gallium arsenide, ceramic, quartz or copper substrates may also be employed. Substrates used for liquid crystal display and other flat panel display applications are also suitably employed, e.g. glass substrates, indium tin oxide coated substrates and the like. A liquid coating resist composition may be applied by any standard means such as spinning, dipping or roller coating.

Also, rather than applying a resist composition directly onto a substrate surface, a coating layer of an antireflective coating composition may be first applied onto a substrate surface and the photoresist coating layer applied over the underlying antireflective coating. A number of antireflective coating compositions may be employed including the compositions disclosed in European Applications Publication Nos. 0542008A1 and 0813114A2, both of the Shipley Company. For resists to be imaged at 248 nm, an antireflective composition that contains a resin binder with anthracene units preferably may be employed.

The exposure energy should be sufficient to effectively activate the photoactive component of the radiation sensitive system to produce a patterned image in the resist coating layer. Suitable exposure energies typically range from about 10 to 300 mJ/cm$^2$. An exposure wavelength in the deep U.V. range often preferably will be used for the photoresists of the invention, particularly exposure wavelengths of sub-250 nm or sub-200 nm such as about 248 nm or 193 nm. Preferably, the exposed resist coating layer will be thermally treated after exposure and prior to development, with suitable post-exposure bake temperatures being from about e.g. 50° C. or greater, more specifically from about 50 to 160° C. After development, the substrate surface bared by development may then be selectively processed, for example chemically etching or plating substrate areas bared of photoresist in accordance with procedures known in the art. Suitable etchants include a hydrofluoric acid etching solution and a plasma gas etch such as an oxygen plasma etch.

All documents mentioned herein are incorporated herein by reference. The following non-limiting examples are illustrative of the invention.

EXAMPLES 1–3

Synthesis of Polymers

EXAMPLE 1

A polymer with a molar feed ratio of 31:22:10:14:23 of isobornyl methacrylate:tert-butyl methacrylate:methacrylic acid: methacrylonitrile: itaconic anhydride was prepared through the following procedure:

Into a 500 mL flask was placed 12.54 g of itaconic annhydride, 15.20 g of tert-butyl methacrylate, 4.58 g of methacrylonitrile, 4.28 g of methacrylic acid, 33.57 g of isobornyl methacrylate, and 100 mL of anhydrous tetrahydrofuran. All reagents were at least 99% pure. The flask was fitted with a magnetic stirring bar, a condenser and an addition funnel. All ingredients were sparged with N$_2$ gas for 20 minutes prior to reaction. In the condenser was placed 0.75 g of Vazo52 free-radical initiator and 25 mL of anhydrous tetrahydrofuran. The solution was brought to 70° C., and then the initiator was added over a 20 minute period. The flask was maintained at 70° C. for 14 hours, and then cooled to room temperature. Polymer was obtained by precipitation into 3 L of hexane, and dried in a Buchner funnel. Then the polymer was re-dissolved into 120 mL of acetone and reprecipitated into 3 L of hexane, and collected on a Buchner funnel. The polymer was dried overnight in a vacuum oven at room temperature. Yield was 49.96 g (66%).

EXAMPLE 2

A polymer with a molar feed ratio of 15:10:28:10:14:23 of isobornyl methacrylate:2,3-dimethyl-2-butylmethacrylate: methacrylate:methacrylic acid: methacrylonitrile: itaconic annhydride was prepared through a similar procedure as Example 1 above.

The 2,3-dimethyl-2-butylmethacrylate was synthesized through the following procedure: Into a 500 mL flask containing a stir bar, and fitted with a condenser, is placed 180 g of annhydrous tetrahydrofuran, 40 g of 2,3-dimethyl-1-butanol and 40.93 g of triethylamine under a $N_2$ atmosphere. To this was dropwise added 40.927 g of purified methacroyl chloride from an addition funnel. The reaction was allowed to warm moderately. After 24 hrs of stirring, the tetrahydrofuran was roto-evaporated from the solution and 100 mL of ethyl acetate was added. The salts were then filtered off though a Buchner funnel. The ethyl acetate was then stripped by use of a rotory-evaporator. A vacuum distillation column was set up with an 8 inch Vigreaux column, stir bar and a few small boiling chips. A fractional distillation was performed and 19.8 g of the product was recovered in the fraction which had a boiling point of approximately 80–87° C. at 6–7 torr of pressure. $^1$H NMR was used to confirm structure and purity.

EXAMPLE 3

A polymer with a molar feed ratio of 15:10:28:10:14:23 2-methyl-2-adamantyl methacrylate: isobornyl methacrylate: methacrylate:2,3-dimethyl-2-butylmethacrylate: methacrylate:methacrylic acid: methacrylonitrile: itaconic annhydride was prepared through the same procedure as Example 1. The 2-methyl-2-adamantyl methacrylate monomer was prepared through a similar procedure as the method shown for monomer synthesis in Example 2, except that 2-adamantanol was used as a starting material instead of 2,3-dimethyl-1-butanol.

EXAMPLES 4–19

Resist Compositions

The following abbreviations are used in the composition descriptions to describe the photoacid generators (PAGs) used in the resist compositions:

perfluorooctansulphonate-norbornene dicarboximide, MDTPFOS;
bis(4-tert-butylphenyl)iodonium perfluorooctane sulphonate, DTBIPFOS;
bis(4-tert-butylphenyl)iodonium trifluoromethyl sulphonate, DTBIPTf;
bis(4-tert-butylphenyl)iodonium camphor sulphonate, DTBIPCs;

All PAGs were purchased from DAYCHEM Corporation or synthesized laboratories using standard methods.

Photoresist compositions suitable for lithographic testing was prepared by dissolving the PAG or combination of PAGs, and the polymer into a stock solution containing 0.0045 g of 1,8-diazabicyclo[5.4.0]undec-7-ene (Aldrich Corp, USA), 0.0075 g of Silwet 7604 (Dow Corning Co., USA) and 43.5 g of propyleneglycol methyl ether acetate (Dow Corp., USA). In example 17 the stock solution contained 0.0071 g of 1,8-diazabicyclo[5.4.0]undec-7-ene, 0.0075 g of Silwet and 43.5 g of propyleneglycol methyl ether acetate. To aid in dissolving DTBIPFOS, DTBIPf, and DTBICs, these materials were added to the resist composition as 5% solutions in ethyl lactate. After dissolution, the resist composition was filtered through either a 0.1 mm or 0.2 mm Teflon filter into a clean bottle. The amounts of PAG(s) and polymers used in these examples is described in Table 1:

TABLE 1

Polymers and photoacid generators used in resist compositions. Weights are given in grams.

| Ex. No. | Polymer Example | weight polymer | weight MDTPFOS | weight DTBITf | weight DTBIPFOS | weight DTBICs |
|---|---|---|---|---|---|---|
| 4-comp | 2 | 7.114 | 0.374 | 0 | 0 | 0 |
| 5-comp | 2 | 6.963 | 0.524 | 0 | 0 | 0 |
| 6-comp | 2 | 6.889 | 0.599 | 0 | 0 | 0 |
| 7-comp | 2 | 7.338 | 0 | 0 | 0.150 | 0 |
| 8-comp | 1 | 7.099 | 0 | 0 | 0.389 | 0 |
| 9 | 2 | 6.983 | 0.449 | 0 | 0.0562 | 0 |
| 10 | 2 | 7.001 | 0.374 | 0 | 0.112 | 0 |
| 11 | 2 | 6.852 | 0.524 | 0 | 0.112 | 0 |
| 12 | 2 | 6.919 | 0.524 | 0 | 0.0449 | 0 |
| 13-comp | 1 | 6.963 | 0.524 | 0 | 0 | 0 |
| 14 | 1 | 6.904 | 0.524 | 0 | 0.0599 | 0 |
| 15 | 1 | 6.941 | 0.524 | 0 | 0.0225 | 0 |
| 16 | 1 | 6.904 | 0.524 | 0 | 0.0225 | 0.0374 |
| 17 | 1 | 7.039 | 0.374 | 0.0749 | 0 | |
| 18 | 3 | 6.919 | 0.524 | 0 | 0 | |
| 19 | 1 | 6.926 | 0.524 | 0 | 0 | 0.0374 |

EXAMPLES 20–32

Lithographic Testing of Resist Compositions Resists of this invention were lithographically tested. Comparison compositions containing single prior-art PAGs also were tested.

In order to assess resolution capability, high-voltage cross-sectional scanning electron microscopic methods were used to examine the printed features. Minimal resolution in an imaged 1:1 pitch grating by choosing an exposure dose such that the patterned 1:1 160 nm lines and 160 nm spaces on the mask actually measured essentially 160 nm in size respectively, and then determining the smallest, essentially full-thickness line which cleanly developed, had a flat top and did not leave residue on the substrate. Photospeed is the exposure dose required in forming such a pattern.

The lithographic processing was performed on modem wafer-processing tools (manufactured by FSI and SVG Companies) using both 150 mm and 200 mm silicon wafers. All processing was done in an essentially base-contaminant free atmosphere (<5 ppb measure amines/ammonia). The wafers were coated with an organic anti-relective film prior to subsequent processing. The photoresist was spun onto the wafers at about 3000 rpm and baked (PAB, post-apply bake) on a 150 mm proximity-gap plate and then rapidly cooled to room temperature to give a film thickness of 4200 Å. Then the film was exposed using a resolution-test pattern on a GCA 0.60 NA ArF (193 nm) wafer stepper at a partial coherence setting of 0.70. Immediately afterwards, the film was baked (PEB, post-exposure bake) on a 150 mm proximity-gap plate, and then rapidly cooled to room temperature. Immediately afterwards the film was developed using an industry-standard 60 second track-single-puddle process with industry standard 0.26 N tetramethylammonium hydroxide developer.

TABLE 2

Results from lithographic testing of the resist compositions of examples. Es refers to the energy to size 1:1 160 mn lines:spaces and ResL refers to the resolution at Es. PAB and PEB are given in units of ° C., Es is in units of mJ/cm$^2$, ResL is in units of nm, and unaccept. designates "unacceptable".

| Example | Composition | PAB | PEB | Es | ResL | Comments |
|---|---|---|---|---|---|---|
| 7-comp | 4 | 140 | 150 | 48 | 150 | fair profile shape |
| 18-comp | 5 | 140 | 150 | 32 | 150 | fair profile shape |
| 19-comp | 6 | 140 | 150 | ** | ** | unaccept. coatings |
| 20-comp | 7 | 140 | 150 | >50 | ** | unaccept. exposure dose |
| 21-comp | 8 | 140 | 155 | ca. 13 | >160 | sloped, pointed profile shape |
| 22 | 9 | 140 | 150 | 28 | 145 | very good profiles |
| 23 | 10 | 140 | 150 | 30 | 145 | good profile shape |
| 24 | 11 | 140 | 150 | 22 | 145 | good profile shape |
| 25 | 12 | 140 | 150 | 24 | 140 | very good profiles |
| 26-comp | 13 | 140 | 155 | 27 | 150 | fair profile shape |
| 27 | 14 | 140 | 155 | 23 | 145 | good profile shape |
| 28 | 15 | 140 | 155 | 26 | 145 | good profile shape |
| 29 | 16 | 140 | 155 | >28 | ** | underexposed |
| 30 | 17 | 140 | 155 | 29 | 150 | good profile shape |
| 31 | 18 | 135 | 130 | 24 | 150 | good profile shape |
| 32 | 19 | 140 | 155 | 27 | 150 | good profile shape |

With reference to the above, ResL can be important to semiconductor device manufacturing because it means that the mask used does not need to be "biased" to correctly size the linewidths of different 1:1 pitch features. This simplifies the manufacturing process and the cost of the masks. In addition, the compositions of this invention show a more preferable profile shape than the comparison resist compositions 17–19 and 21, namely improvements in the nature of the interface between the resist pattern and the substrate in which the line edge is more vertical and more free of undesirable scum or edge residues. Improved profile shape is useful for semiconductor manufacturing in two ways: improved metrological testing reliability and in maintaining pattern fidelity during plasma-etch processing steps.

Comparison of Examples 22–25, which contain blends of non-ionic and ionic PAG with comparison examples 17–19, which contain solely non-ionic PAG, or with comparison examples 20–21, which contain solely ionic-PAG show that blending of both types of PAGs into a single resist composition gives improvements in resolution, photospeed and profile shape.

This work was repeated with the polymer of another structure containing a different leaving group (the polymer of example 2) in Examples 26–30 and Example 32. Improvements in resolution, photospeed and profile shape are seen in examples 27 and 28. Examples 30 and 32 show improved profile shape. In particular, the improvement in profile shape observed in the compositions which contain the blended ionic and non-ionic PAGs and the polymer of Example 2 are similar to that which when the polymer of Example 1 was used in the composition, namely an improvement in the nature of the interface between the resist pattern and the substrate in which the line edge is more vertical and more free of undesirable scum or edge residues.

The foregoing description of the invention is merely illustrative thereof, and it is understood that variations and modifications can be effected without departing from the spirit or scope of the invention as set forth in the following claims.

What is claimed is:

1. A method for forming a photoresist relief image on a microelectronic wafer substrate or a flat panel display substrate comprising:

(a) applying a coating layer of a photoresist composition on a microelectronic wafer substrate or a flat panel display substrate, the photoresist composition comprising i) a resin binder that comprises an alkyl acrylate-phenol polymer and ii) a mixture of photoacid generator compounds in an amount sufficient to permit development of an exposed coating layer of the composition, the photoacid generator compound mixture comprising at least one photoacid generator that is an ionic compound and at least one photoacid generator that is a non-ionic compound that is selected from the group of a sulfonate ester compound, disulfone compound, or nitrobenzyl compound; and (b) exposing the photoresist coating layer to patterned activating radiation having a wavelength of less than about 250 nm and developing the exposed photoresist layer to provide a relief image.

2. The method of claim 1 wherein the photoresist resin comprises one or more units selected from the group consisting of isobornyl methacrylate, methacrylonitrile, itaconic anhydride, methacrylic acid, tert-butyl methacrylate, 2-methyl-2-adamantyl methacrylate, and 2,3-dimethyl-2-butyl-methacrylate.

3. The method of claim 1 wherein the activating radiation has a wavelength of about 248 nm.

4. A method for forming a photoresist relief image on a microelectronic wafer substrate or a flat panel display substrate comprising:

(a) applying a coating layer of a photoresist composition on a microelectronic wafer substrate or a flat panel display substrate, the photoresist composition comprising i) a resin that comprises an alkyl acrylate-phenol polymer and ii) a mixture of photoacid generator compounds in an amount sufficient to permit development of an exposed coating layer of the composition, the photoacid generator compound mixture comprising at least one photoacid generator that is an ionic compound and at least one photoacid generator that is a non-ionic compound, and the photoacid generated by both the ionic photoacid generator and the non-ionic photoacid generator is a perfluoroalkyl sulfonic acid; and (b) exposing the photoresist coating layer to patterned activating radiation having a wavelength of less than about 250 nm and developing the exposed photoresist layer to provide a relief image.

5. The method of claim 4 wherein an antireflective coating composition underlies the photoresist composition coating layer.

6. The method of claim 4 wherein the photoresist resin comprises one or more units selected from the group consisting of isobornyl methacrylate, methacrylonitrile, itaconic anhydride, methacrylic acid, tert-butyl methacrylate, 2-methyl-2-adamantyl methacrylate, and 2,3-dimethyl-2-butyl-methacrylate.

7. The method of claim 4 wherein the activating radiation has a wavelength of about 248 nm.

8. A method for forming a photoresist relief image on a microelectronic wafer substrate or a flat panel display substrate comprising:

(a) applying a coating layer of a photoresist composition on a microelectronic wafer substrate or a flat panel display substrate, the photoresist composition comprising i) a resin that comprises an alkyl acrylate-phenol polymer and ii) a mixture of photoacid generator compounds in an amount sufficient to permit development of an exposed coating layer of the composition, the photoacid generator compound mixture comprising at least one photoacid generator that is an ionic compound and at least one photoacid generator that is a non-ionic compound, and the same photoacid is generated by both the ionic photoacid generator and the non-ionic photoacid generator; and (b) exposing the photoresist coating layer to patterned activating radiation having a wavelength of less than about 250 nm and developing the exposed photoresist layer to provide a relief image.

9. The method of claim 8 wherein the photoresist resin comprises one or more units selected from the group consisting of isobornyl methacrylate, methacrylonitrile, itaconic anhydride, methacrylic acid, tert-butyl methacrylate, 2-methyl-2-adamantyl methacrylate, and 2,3-dimethyl-2-butyl-methacrylate.

10. The method of claim 8 wherein the activating radiation has a wavelength of about 248 mn.

* * * * *